United States Patent
Shin et al.

(10) Patent No.: US 10,840,338 B2
(45) Date of Patent: Nov. 17, 2020

(54) SEMICONDUCTOR DEVICE INCLUDING GRAPHENE AND METHOD OF MANUFACTURING THE SEMICONDUCTOR DEVICE

(71) Applicant: Samsung Electronics Co., Ltd., Suwon-si (KR)

(72) Inventors: Keunwook Shin, Yongin-si (KR); Hyeonjin Shin, Suwon-si (KR); Yeonchoo Cho, Seongnam-si (KR); Seunggeol Nam, Suwon-si (KR); Seongjun Park, Seoul (KR); Yunseong Lee, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/807,096

(22) Filed: Nov. 8, 2017

(65) Prior Publication Data

US 2018/0350915 A1     Dec. 6, 2018

(30) Foreign Application Priority Data

Jun. 1, 2017    (KR) ........................ 10-2017-0068664

(51) Int. Cl.
    *H01L 29/16*       (2006.01)
    *H01L 21/02*       (2006.01)
                 (Continued)

(52) U.S. Cl.
    CPC ........ *H01L 29/1606* (2013.01); *C01B 32/186* (2017.08); *H01L 21/0262* (2013.01); *H01L 21/02527* (2013.01); *H01L 21/02639* (2013.01); *H01L 21/02645* (2013.01); *H01L 21/3065* (2013.01); *H01L 23/53276* (2013.01); *H01L 29/167* (2013.01); *H01L 29/1608* (2013.01); *H01L 29/66015* (2013.01)

(58) Field of Classification Search
CPC ... H01L 2924/00014; H01L 2924/0002; H01L 29/1606; H01L 2924/00; H01L 21/02527
See application file for complete search history.

(56) References Cited

U.S. PATENT DOCUMENTS 9,064,698 B1    6/2015   Khakifirooz et al.
9,543,156 B1    1/2017   Hu
(Continued)

FOREIGN PATENT DOCUMENTS

JP          5167479 B2     3/2013
KR    10-1381008 B1     4/2014

OTHER PUBLICATIONS

Yang, W. et al., "Epitaxial growth of single-domain graphene on hexagonal boron nitride," Nature Materials, vol. 12, No. 9, Sep. 2013, pp. 792-797.
(Continued)

*Primary Examiner* — Tony Tran
(74) *Attorney, Agent, or Firm* — Harness, Dickey & Pierce, P.L.C.

(57) ABSTRACT

A semiconductor device includes a substrate and a graphene layer. The substrate includes an insulator and a semiconductor. The graphene layer is grown on a surface of the semiconductor. The semiconductor includes at least one of a group IV material and a group III-V compound. A method of manufacturing the semiconductor device is disclosed.

1 Claim, 7 Drawing Sheets

(51) Int. Cl.
*H01L 29/66* (2006.01)
*C01B 32/186* (2017.01)
*H01L 21/3065* (2006.01)
*H01L 23/532* (2006.01)
*H01L 29/167* (2006.01)

(56) References Cited

U.S. PATENT DOCUMENTS

| | | |
|---|---|---|
| 2011/0042687 A1 | 2/2011 | Chu et al. |
| 2015/0144885 A1 | 5/2015 | Choi et al. |
| 2015/0376778 A1* | 12/2015 | Davis ................. H01L 21/0237 430/323 |
| 2016/0111180 A1 | 4/2016 | Joo et al. |
| 2016/0343891 A1* | 11/2016 | Heo ................. H01L 31/035218 |
| 2018/0033864 A1* | 2/2018 | Cao ................... H01L 29/66568 |

OTHER PUBLICATIONS

Wang, G. et al., "Direct Growth of Graphene Film on Germanium Substrate," Scientific Reports, vol. 3, Aug. 19, 2013, pp. 1-6.
Extended European Search Report for EP Appl. No. 17204757.3, dated Jul. 16, 2018.

* cited by examiner

SEMICONDUCTOR DEVICE INCLUDING GRAPHENE AND METHOD OF MANUFACTURING THE SEMICONDUCTOR DEVICE

CROSS-REFERENCE TO RELATED APPLICATION

This application claims priority under 35 U.S.C. § 119 to Korean Patent Application No. 10-2017-0068664, filed on Jun. 1, 2017, in the Korean Intellectual Property Office, the disclosure of which is incorporated herein in its entirety by reference.

BACKGROUND

1. Field

The present disclosure relates to a semiconductor device, and more particularly, to a semiconductor device including graphene and a method of manufacturing the semiconductor device.

2. Description of Related Art

In semiconductor device fields, a new material may be used to limit and/or prevent a resistance increase caused by a reduced width of metal wiring and/or provide a thin and new barrier material. Recently, studies on graphene are being actively conducted.

Graphene is a crystalline material having a hexagonal honeycomb structure as carbon atoms are 2-dimensionally connected, and is very thin, having a thickness of a single atom. The graphene may be synthesized via chemical vapor deposition (CVD) or obtained by detaching graphite layer by layer.

SUMMARY

Provided is a semiconductor device including graphene and a method of manufacturing the semiconductor device.

Additional aspects will be set forth in part in the description which follows and, in part, will be apparent from the description, or may be learned by practice of the presented embodiments.

According to some example embodiments of inventive concepts, a semiconductor device includes a substrate and a graphene layer. The substrate may include an insulator and a semiconductor. The graphene layer may be grown on a surface of the semiconductor. The semiconductor may include at least one of a group IV material or a group III-V compound.

In some example embodiments, the semiconductor may include at least one of silicon (Si), germanium (Ge), tin (Sn), gallium arsenide (GaAs), gallium phosphide (GaP), indium arsenide (InAs), indium phosphide (InP), indium antimony (InSb), gallium antimony (GaSb), gallium nitride (GaN), indium nitride (InN), aluminum phosphide (AlP), aluminum arsenide (AlAs), or aluminum nitride (AlN).

In some example embodiments, the semiconductor may further include a doping material.

In some example embodiments, the insulator may include at least one of silicon oxide ($SiO_2$), silicon nitride (SiN), silicon oxynitride ($SiO_xN_y$), silicon oxycarbide ($SiO_xC_y$), germanium oxynitride ($GeO_xN_y$), germanium oxycarbide ($GeO_xC_y$), aluminum oxide ($Al_2O_3$), hafnium oxide ($HfO_2$), or zirconium oxide ($ZrO_2$), wherein $0<x$ and $y<1$.

In some example embodiments, the insulator may be on the semiconductor, the insulator may be an insulating layer, and the semiconductor may be a semiconductor substrate.

In some example embodiments, the semiconductor may be a semiconductor layer, the insulator may include an insulator substrate.

In some example embodiments, a surface of the semiconductor and a surface of the insulator may be on a same plane relative to each other or on different planes relative to each other.

According to some example embodiments of inventive concepts, a semiconductor device includes a substrate, a first graphene layer, and a second graphene layer. The substrate may include an insulator and a semiconductor. The first graphene layer may be grown on a surface of the semiconductor. The second graphene layer may be grown on a surface of the insulator. A thickness of the second graphene layer may be different than a thickness of the first graphene layer.

In some example embodiments, the thickness of the first graphene layer may be greater than the thickness of the second graphene layer.

In some example embodiments, the semiconductor may include at least one of a group IV material or a group III-V compound. The semiconductor may further include a doping material.

According to some example embodiments of inventive concepts, a method of manufacturing a semiconductor device, the method includes preparing a substrate and growing a first graphene layer. The substrate may include an insulator and a semiconductor. The first graphene layer may be grown on a surface of the semiconductor using a plasma-enhanced chemical vapor deposition (PECVD) process. The semiconductor may include at least one of a group IV material or a group III-V compound.

In some example embodiments, the semiconductor may further include a doping material.

In some example embodiments, the growing the first graphene layer may not form a graphene layer on a surface of the insulator.

In some example embodiments, the method may further include growing a second graphene layer on a surface of the insulator using the PECVD process. A thickness of the second graphene layer may be different than a thickness of the first graphene layer. The thickness of at least one of the first graphene layer or the second graphene layer may depend on a process time of the PECVD process.

In some example embodiments, a thickness of the second graphene layer may be less than a thickness of the first graphene layer.

In some example embodiments, a source gas for the PECVD process may include a hydrocarbon. A process temperature of the PECVD process may be from 300° C. to 700° C.

In some example embodiments, a process pressure of the PECVD process may be from 10 mTorr to 50 mTorr. A plasma power of the PECVD process may be from 50 W to 300 W.

According to some example embodiments, a method of manufacturing a semiconductor device may include growing a first graphene layer on a surface of a semiconductor using a plasma-enhanced chemical vapor deposition (PECVD) process. The semiconductor may be part of a substrate including an insulator and the semiconductor. The semiconductor may include at least one of a group IV material or a group III-V compound.

BRIEF DESCRIPTION OF THE DRAWINGS

These and/or other aspects will become apparent and more readily appreciated from the following description of some example embodiments, taken in conjunction with the accompanying drawings in which.

DETAILED DESCRIPTION

Figure 1:
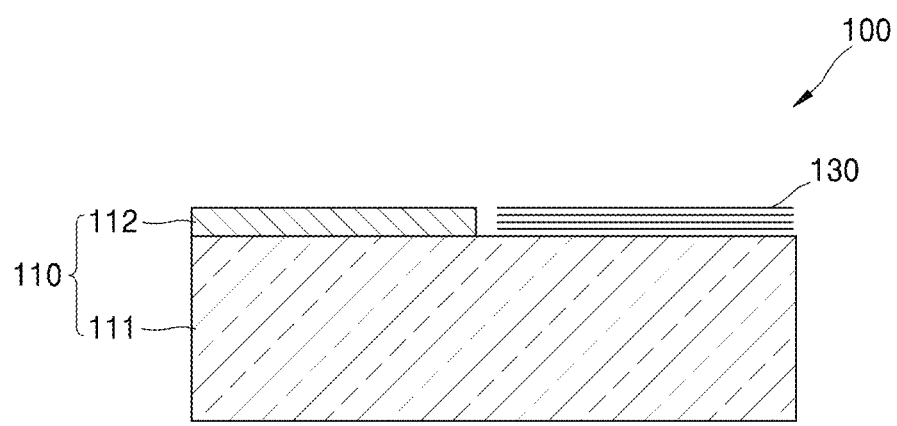
FIG. 1 is a cross-sectional view of a semiconductor device according to some example embodiments.

Reference will now be made in detail to some example embodiments that are illustrated in the accompanying drawings, wherein like reference numerals refer to like elements throughout and sizes and thicknesses of components may be exaggerated for clarity. In this regard, the present embodiments may be embodied different forms and should not be construed as being limited to the descriptions set forth herein. Accordingly, the embodiments are merely described below, by referring to the figures, to explain aspects. When a certain material layer is on a substrate or another layer, the certain material layer may be directly contact the substrate or the other layer or a third layer may exist between the certain material layer and the substrate or the other layer. Also, since a material forming each layer is an example, and thus another material may be used. Expressions such as "at least one of," when preceding a list of elements, modify the entire list of elements and do not modify the individual elements of the list.

FIG. 1 is a cross-sectional view of a semiconductor device 100 according to some example embodiments.

Referring to FIG. 1, the semiconductor device 100 includes a substrate 110 and a graphene layer 130 grown on a surface of the substrate 110. Here, the substrate 110 includes two types of materials, e.g., a semiconductor and an insulator. The graphene layer 130 is grown on a surface of the semiconductor of the substrate 110.

The substrate 110 may include a semiconductor substrate 111 and an insulating layer 112 provided on a surface (for example, on a top surface) of the semiconductor substrate 111. The insulating layer 112 may be patterned in a certain shape on the surface of the semiconductor substrate 111. Here, the surface of the semiconductor substrate 111 and a surface of the insulating layer 112 may be provided on planes having different heights.

The semiconductor substrate 111 may include at least one of a group IV material and a group III-V compound. For example, the semiconductor substrate 111 may include at least one of silicon (Si), germanium (Ge), tin (Sn), gallium arsenide (GaAs), gallium phosphide (GaP), indium arsenide (InAs), indium phosphide (InP), indium antimony (InSb), gallium antimony (GaSb), gallium nitride (GaN), indium nitride (InN), aluminum phosphide (AlP), aluminum arsenide (AlAs), or aluminum nitride (AlN). However, a material of the semiconductor substrate 111 is not limited thereto, and may include any one of various semiconductor materials. For example, the semiconductor substrate 111 may include a Si—Ge—Sn—C alloy, a Si—Ge—C alloy, or a Si—Ge—Sn alloy.

Meanwhile, the semiconductor substrate 111 may further include a doping material. The doping material may include at least one of boron (B), As, P, Sb, carbon (C), Si, or magnesium (Mg). However, the doping material is not limited thereto. Here, concentration of the doping material may be, for example, from about $10^{15}$ to $10^{22}$ cm$^{-3}$.

The insulating layer 112 may include at least one of silicon oxide (SiO$_2$), silicon nitride (SiN), silicon oxynitride (SiO$_x$N$_y$)(wherein 0<x and y<1), silicon oxycarbide (SiO$_x$C$_y$) (wherein 0<x and y<1), germanium oxynitride (GeO$_x$N$_y$) (wherein 0<x and y<1), germanium oxycarbide (GeO$_x$C$_y$) (wherein 0<x and y<1), aluminum oxide (Al$_2$O$_3$), hafnium oxide (HfO$_2$), and zirconium oxide (ZrO$_2$).

The graphene layer 130 is formed on an exposed surface of the semiconductor substrate 111. Here, the graphene layer 130 may include one graphene layer or a plurality of stacked graphene layers. Graphene is a crystalline material having a hexagonal honeycomb structure in which carbon atoms are two-dimensionally connected. Graphene is in the limelight as a material applicable to various devices due to various characteristics, such as a very thin thickness of an atom size level, excellent electric conductivity, a strong mechanical characteristic, and chemical stability.

The graphene layer 130 may be grown on the surface of the semiconductor substrate 111 via a plasma-enhanced chemical vapor deposition (PECVD) process described later. According to some example embodiments, the graphene layer 130 is not formed on the surface of the insulating layer 112, but is formed only on the exposed surface of the semiconductor substrate 111. As such, the semiconductor device 100, in which the graphene layer 130 is formed only on the surface of the semiconductor substrate 111, may be realized by adjusting a growth time during the PECVD process.

A method of manufacturing the semiconductor device 100 will now be described.

First, the substrate 110 including the semiconductor and the insulator are prepared in a reaction chamber (not shown). Here, the substrate 110 may include the semiconductor substrate 111 and the insulating layer 112 patterned on the surface of the semiconductor substrate 111.

Then, the graphene layer 130 is grown on the exposed surface of the semiconductor substrate 111 through a CVD process, for example, through a PECVD process. Here, inductively coupled plasma-chemical vapor deposition (ICP-CVD) may be performed as the PECVD process, but an example of the PECVD process is not limited thereto.

A source gas supplied into the reaction chamber during the PECVD process for growing the graphene layer 130 on the surface of the semiconductor substrate 111 may be hydrocarbon, such as methane (CH$_4$), acetylene (C$_2$H$_2$), or ethylene ($C_2H_4$). Also, a process temperature in the reaction chamber may be from about 300° C. to about 700° C., but is not limited thereto.

Plasma power used during the PECVD process may be from about 50 W to about 300 W, and process pressure in the reaction chamber may be from about 10 mTorr to about 50 mTorr, but are not limited thereto.

When the PECVD process is performed under such process conditions, graphene starts to grow on the exposed surface of the semiconductor substrate 111 in the reaction chamber. Here, the graphene layer 130 may be selectively grown only on the exposed surface of the semiconductor substrate 111 by suitably adjusting the growth time. Carbide may be formed on an interface between the semiconductor substrate 111 and the graphene layer 130. However, inventive concepts are not limited thereto, and carbide may not be formed on the interface between the semiconductor substrate 111 and the graphene layer 130. As will be described below, when an $SiO_2$ insulating layer is patterned on a surface of a Ge semiconductor substrate, a graphene layer may be grown only on a surface of the Ge semiconductor substrate by adjusting a growth time to about 120 minutes or less.

Figure 2:
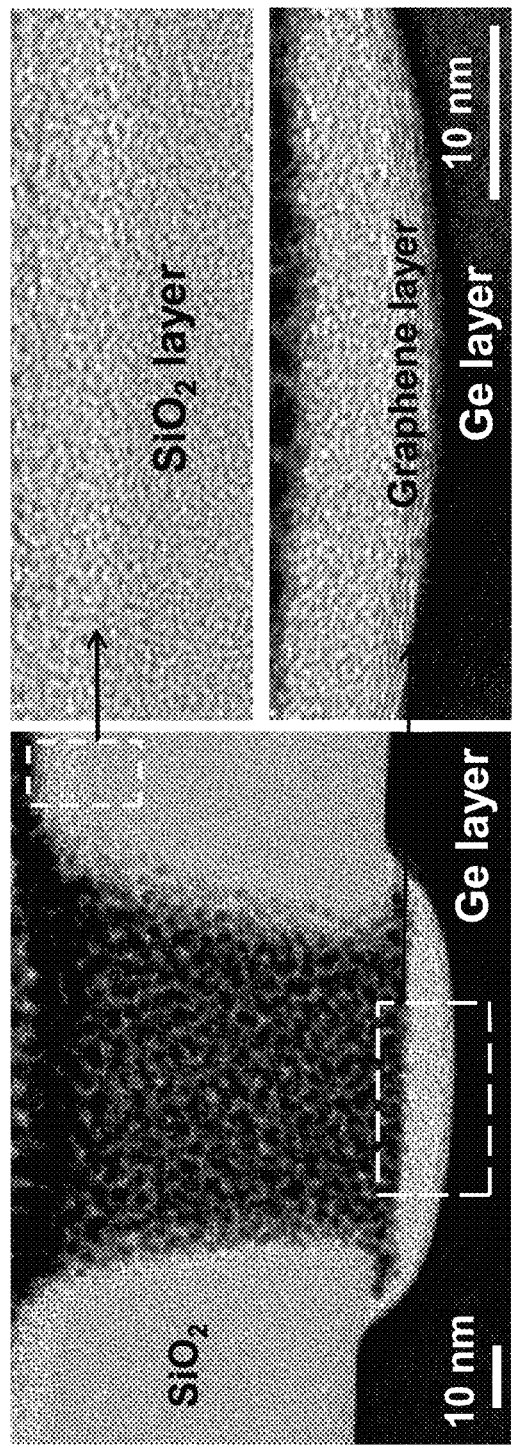
FIG. 2 is a photograph of a graphene layer grown, via a plasma-enhanced chemical vapor deposition (PECVD) process, on a surface of a germanium (Ge) semiconductor layer on which a silicon oxide (SiO$_2$) insulating layer is patterned.

FIG. 2 is a photograph of a graphene layer grown, via a PECVD process, on a surface of a Ge semiconductor layer on which a $SiO_2$ insulating layer is patterned. During the PECVD process, a $CH_4$ source gas, process pressure of 20 mTorr, a process temperature of 580° C., and plasma power of 150 W were used as process conditions. Also, a growth time was 60 minutes. Referring to FIG. 2, the graphene layer is selectively grown only on an exposed surface of the Ge semiconductor layer.

As such, according to some example embodiments, the semiconductor device 100 may be manufactured by growing the graphene layer 130 directly on the surface of the semiconductor substrate 111 by using the PECVD process. Generally, a method of transferring a graphene layer grown via CVD process to a semiconductor substrate by using polymethyl methacrylate (PMMA) is used so as to manufacture a semiconductor device including a graphene layer. However, it is difficult to accurately form a graphene layer on a desired region as a line width of a semiconductor device is recently gradually reduced, and PMMA residue may be generated or an oxide may be formed according to a wet process.

According to some example embodiments, the graphene layer 130 is directly grown on the surface of the semiconductor substrate 111 by using the PECVD process. Also, the graphene layer 130 may be selectively grown only on a desired region according to a structure of the substrate 110 while directly growing the graphene layer 130.

Figure 3:
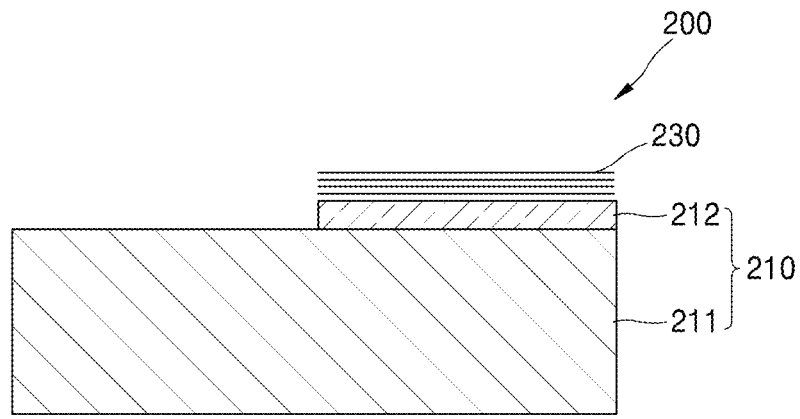
FIG. 3 is a cross-sectional view of a semiconductor device according to some example embodiments.

FIG. 3 is a cross-sectional view of a semiconductor device 200 according to some example embodiments.

Referring to FIG. 3, the semiconductor device 200 includes a substrate 210 including an insulator and a semiconductor, and a graphene layer 230 grown on a surface of the semiconductor of the substrate 210. The substrate 210 may include an insulator substrate 211 and a semiconductor layer 212 patterned on a surface of the insulator substrate 211 in a certain form. Here, a surface of the insulator substrate 211 and a surface of the semiconductor layer 212 may be provided on planes having different heights.

The insulator substrate 211 may include at least one of $SiO_2$, SiN, $SiO_xN_y$, wherein 0<x and y<1, $SiO_xC_y$, wherein 0<x and y<1, $GeO_xN_y$, wherein 0<x and y<1, $GeO_xC_y$, wherein 0<x and y<1, $Al_2O_3$, $HfO_2$, or $ZrO_2$.

The semiconductor layer 212 may include at least one of a group IV material and a group III-V compound. For example, the semiconductor layer 212 may include at least one of Si, Ge, Sn, GaAs, GaP, InAs, InP, InSb, GaSb, GaN, InN, AlP, AlAs, or AlN. However, a material of the semiconductor layer 212 is not limited thereto, and may include various semiconductor materials. For example, the semiconductor layer 212 may include an Si—Ge—Sn—C alloy, an Si—Ge—C alloy, or an Si—Ge—Sn alloy.

The semiconductor layer 212 may further include a doping material. The doping material may include at least one material from among B, As, P, Sb, C, Si, and Mg, but is not limited thereto. Here, concentration of the doping material may be from about $10^{15}$ to about $10^{22}$ cm$^{-3}$.

The graphene layer 230 is formed on the surface of the semiconductor layer 212. Here, the graphene layer 230 may include one graphene (e.g., an atomic layer of graphene) or a plurality of stacked graphenes. The graphene layer 230 may be grown on the surface of the semiconductor layer 212 via a PECVD process. According to some example embodiments, the graphene layer 230 is not formed on the surface of the insulator substrate 211 but is formed only on the surface of the semiconductor layer 212. As such, the semiconductor device 200, in which the graphene layer 230 is formed only on the surface of the semiconductor layer 212, may be realized by adjusting a growth time during the PECVD process.

A method of manufacturing the semiconductor device 200 will now be described.

First, the substrate 210 including the semiconductor and the insulator are prepared in a reaction chamber (not shown). Here, the substrate 210 may include the insulator substrate 211 and the semiconductor layer 212 patterned on the surface of the insulator substrate 211.

Then, the graphene layer 230 is grown on the surface of the semiconductor layer 212 through a PECVD process. A source gas supplied into the reaction chamber during the PECVD process may be hydrocarbon, such as $CH_4$, $C_2H_2$, or $C_2H_4$. Also, a process temperature in the reaction chamber may be from about 300° C. to about 700° C. Plasma power used during the PECVD process may be from about 50 W to about 300 W, and process pressure in the reaction chamber may be from about 10 mTorr to about 50 mTorr. However, process conditions are not limited thereto.

When the PECVD process is performed under such process conditions, graphene starts to grow on the surface of the semiconductor layer 212 in the reaction chamber, and the graphene layer 230 having a certain thickness may be formed. Here, the graphene layer 230 may be selectively grown only on the surface of the semiconductor layer 212 by suitably adjusting the growth time.

As such, the semiconductor device 200 may be manufactured by growing the graphene layer 230 directly only on the surface of the semiconductor layer 212 patterned on the insulator substrate 211 by using the PECVD process. Also, the graphene layer 230 may be selectively grown only on a desired region according to a structure of the substrate 210 when the graphene layer 230 is directly grown.

Figure 4:
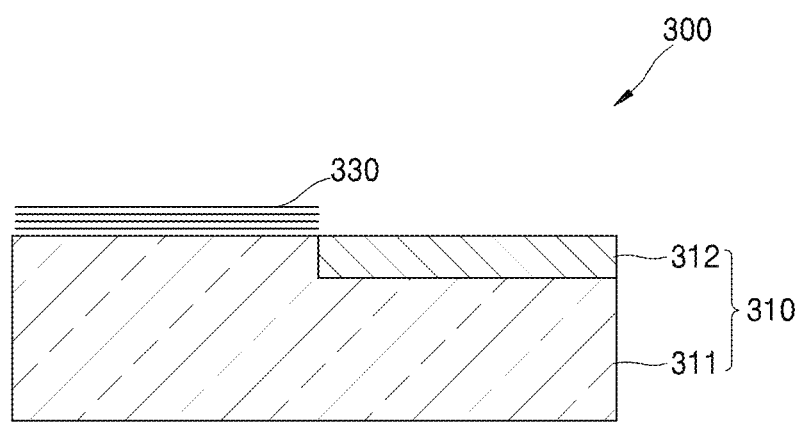
FIG. 4 is a cross-sectional view of a semiconductor device according to some example embodiments.

FIG. 4 is a cross-sectional view of a semiconductor device 300 according to some example embodiments.

Referring to FIG. 4, the semiconductor device 300 includes a substrate 310 including an insulator and a semiconductor, and a graphene layer 330 grown on a surface of the semiconductor of the substrate 310. The substrate 310 may include a semiconductor substrate 311 and an insulating layer 312 patterned on a surface of the semiconductor substrate 311. Here, the semiconductor substrate 311 may include surfaces having different heights, and the insulating layer 312 is provided on a low surface from among the surfaces of the semiconductor substrate 311. Accordingly, an exposed surface of the semiconductor substrate 311 and a surface of the insulating layer 312 may be on the same plane.

The semiconductor substrate 311 may include at least one of a group IV material and a group III-V compound. For example, the semiconductor substrate 311 may include at least one material from among Si, Ge, Sn, GaAs, GaP, InAs, InP, InSb, GaSb, GaN InN, AlP, AlAs, and AlN. However, a material of the semiconductor substrate 311 is not limited thereto, and may include various semiconductor materials. For example, the semiconductor substrate 311 may include an Si—Ge—Sn—C alloy, an Si—Ge—C alloy, or an Si—Ge—Sn alloy. The semiconductor substrate 311 may further include a doping material including at least one material from among B, As, P, Sb, C, Si, and Mg.

The insulating layer 312 may include at least one material from among $SiO_2$, SiN, $SiO_xN_y$, wherein 0<x and y<1, $SiO_xC_y$, wherein 0<x and y<1, $GeO_xN_y$, wherein 0<x and y<1, $GeO_xC_y$, wherein 0<x and y<1, $Al_2O_3$, $HfO_2$, and $ZrO_2$.

The graphene layer 230 is formed on the exposed surface of the semiconductor substrate 311. The graphene layer 330 may include one graphene or a plurality of stacked graphenes. Here, the graphene layer 330 is not formed on the surface of the insulating layer 312 but is formed only on the exposed surface of the semiconductor substrate 311.

In order to manufacture the semiconductor device 300, the substrate 310 including the semiconductor and the insulator are prepared. The substrate 310 may include the semiconductor substrate 311 and the insulating layer 312 provided on the surface of the semiconductor substrate 311. Here, the exposed surface of the semiconductor substrate 311 and the surface of the insulating layer 312 may be on the same plane.

Then, the graphene layer 330 is grown only the exposed surface of the semiconductor substrate 311 through a PECVD process. A source gas supplied into a reaction chamber during the PECVD process may be hydrocarbon, such as $CH_4$, $C_2H_2$, or $C_2H_4$. Also, a process temperature in the reaction chamber may be from about 300° C. to about 700° C. Plasma power used during the PECVD process may be from about 50 W to about 300 W, and process pressure in the reaction chamber may be from about 10 mTorr to about 50 mTorr. However, process conditions are not limited thereto.

When the PECVD process is performed under such process conditions, graphene starts to grow on the surface of the semiconductor substrate 311, and the graphene layer 330 having a certain thickness may be formed. Here, the graphene layer 330 may be selectively grown only on the surface of the semiconductor substrate 311 by suitably adjusting the growth time.

Figure 5:
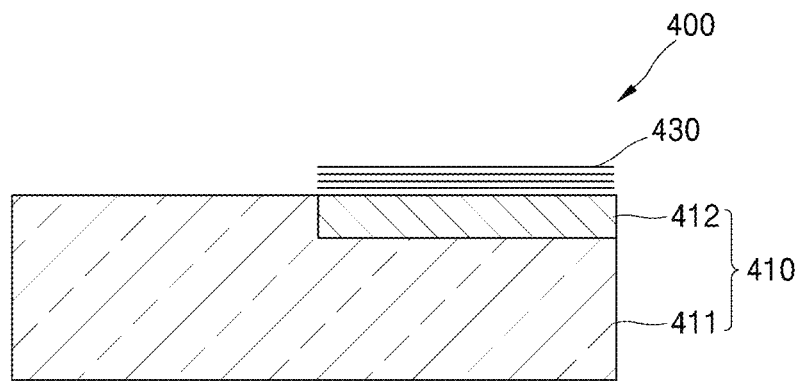
FIG. 5 is a cross-sectional view of a semiconductor device according to some example embodiments.

FIG. 5 is a cross-sectional view of a semiconductor device 400 according to some example embodiments.

Referring to FIG. 5, the semiconductor device 400 includes a substrate 410 including an insulator and a semiconductor, and a graphene layer 430 grown on a surface of the semiconductor of the substrate 410. The substrate 410 may include an insulator substrate 411 and a semiconductor layer 412 patterned on a surface of the insulator substrate 411. Here, the insulator substrate 411 may include surfaces having different heights, and the semiconductor layer 412 is provided on a low surface from among the surfaces of the insulator substrate 411. Accordingly, an exposed surface of the insulator substrate 411 and a surface of the semiconductor layer 412 may be on the same plane.

The insulator substrate 411 may include at least one material from among $SiO_2$, SiN, $SiO_xN_y$, wherein 0<x and y<1, $SiO_xC_y$, wherein 0<x and y<1, $GeO_xN_y$, wherein 0<x and y<1, $GeO_xC_y$, wherein 0<x and y<1, $Al_2O_3$, $HfO_2$, and $ZrO_2$.

The semiconductor layer 412 may include at least one of a group IV material and a group III-V compound. For example, the semiconductor layer 412 may include at least one material from among Si, Ge, Sn, GaAs, GaP, InAs, InP, InSb, GaSb, GaN InN, AlP, AlAs, and AlN. However, a material of the semiconductor layer 412 is not limited thereto, and may include various semiconductor materials. For example, the semiconductor layer 412 may include an Si—Ge—Sn—C alloy, an Si—Ge—C alloy, or an Si—Ge—Sn alloy. Meanwhile, the semiconductor layer 412 may further include a doping material including at least one material from among B, As, P, Sb, C, Si, and Mg.

The graphene layer 430 is formed on the surface of the semiconductor layer 412. Here, the graphene layer 430 may include one graphene or a plurality of stacked graphenes. The graphene layer 430 is not formed on the surface of the insulator substrate 411 but is formed only on the surface of the semiconductor layer 412.

In order to manufacture the semiconductor device 400, first, the substrate 410 including the semiconductor and the insulator are prepared. The substrate 410 may include the insulator substrate 411 and the semiconductor layer 412 provided on the surface of the insulator substrate 411. Here, the exposed surface of the insulator substrate 411 and the surface of the semiconductor layer 412 may be on the same plane.

Then, the graphene layer 430 is grown only the exposed surface of the semiconductor layer 412 through a PECVD process. A source gas supplied into a reaction chamber during the PECVD process may be hydrocarbon, such as $CH_4$, $C_2H_2$, or $C_2H_4$. Also, a process temperature in the reaction chamber may be from about 300° C. to about 700° C. Plasma power used during the PECVD process may be from about 50 W to about 300 W, and process pressure in the reaction chamber may be from about 10 mTorr to about 50 mTorr. However, process conditions are not limited thereto.

When the PECVD process is performed under such process conditions, graphene starts to grow on the surface of the semiconductor layer 412, and the graphene layer 430 having a certain thickness may be formed. Here, the graphene layer 430 may be selectively grown only on the surface of the semiconductor layer 412 by suitably adjusting the growth time.

Figure 6:
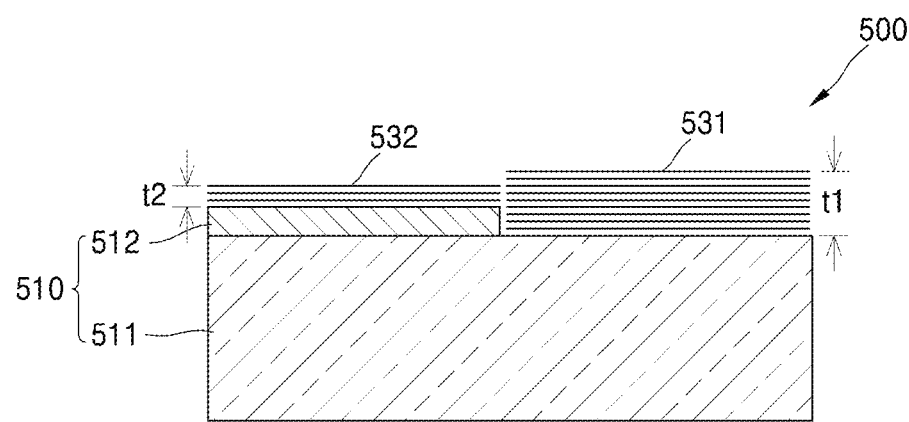
FIG. 6 is a cross-sectional view of a semiconductor device according to some example embodiments.

FIG. 6 is a cross-sectional view of a semiconductor device 500 according to some example embodiments.

Referring to FIG. 6, the semiconductor device 500 includes a substrate 510 including a semiconductor and an insulator, a first graphene layer 531 grown on a surface of the semiconductor of the substrate 510, and a second graphene layer 532 grown on a surface of the insulator of the substrate 510. The substrate 510 may include a semiconductor substrate 511 and an insulating layer 512 provided on a surface of the semiconductor substrate 511. The insulating layer 512 may be patterned on the surface of the semiconductor substrate 511 in a certain form. Here, the surface of the semiconductor substrate 511 and a surface of the insulating layer 512 may be provided on planes having different heights.

The semiconductor substrate 511 may include at least one of a group IV material and a group III-V compound. For example, the semiconductor substrate 511 may include at least one material from among Si, Ge, Sn, GaAs, GaP, InAs, InP, InSb, GaSb, GaN InN, AlP, AlAs, and AlN. However, a material of the semiconductor substrate 511 is not limited thereto, and may include various semiconductor materials. For example, the semiconductor substrate 511 may include an Si—Ge—Sn—C alloy, an Si—Ge—C alloy, or an Si—Ge—Sn alloy.

The semiconductor substrate 511 may further include a doping material. The doping material may include at least one material from among B, As, P, Sb, C, Si, and Mg, but is not limited thereto. Here, concentration of the doping material may be from about $10^{15}$ to about $10^{22}$ cm$^{-3}$.

The insulating layer 512 may include at least one material from among SiO$_2$, SiN, SiO$_x$N$_y$, wherein 0<x and y<1, SiO$_x$C$_y$, wherein 0<x and y<1, GeO$_x$N$_y$, wherein 0<x and y<1, GeO$_x$C$_y$, wherein 0<x and y<1, Al$_2$O$_3$, HfO$_2$, and ZrO$_2$.

The first graphene layer 531 is formed on an exposed surface of the semiconductor substrate 511, and the second graphene layer 532 is formed on the surface of the insulating layer 612. Here, the first and second graphene layers 531 and 532 may each include one graphene or a plurality of stacked graphenes.

The first and second graphene layers 531 and 532 may have different thicknesses. For example, a thickness t1 of the first graphene layer 531 may be greater than a thickness t2 of the second graphene layer 532. The first and second graphene layers 531 and 532 may be respectively grown on the surface of the semiconductor substrate 511 and the surface of the insulating layer 512 via a PECVD process to have different thicknesses. The semiconductor device 500, in which the first and second graphene layers 531 and 532 having different thicknesses are formed respectively on the surface of the semiconductor substrate 511 and on the surface of the insulating layer 512, may be realized by adjusting a growth time during the PECVD process.

A method of manufacturing the semiconductor device 500 will now be described.

First, the substrate 510 including the semiconductor and the insulator are prepared in a reaction chamber (not shown). Here, the substrate 510 may include the semiconductor substrate 511 and the insulating layer 512 patterned on the surface of the semiconductor substrate 511.

Then, the first and second graphene layers 531 and 532 are grown respectively on the exposed surface of the semiconductor substrate 511 and on the surface of the insulating layer 512 through a PECVD process. A source gas supplied into a reaction chamber during the PECVD process may be hydrocarbon, such as CH$_4$, C$_2$H$_2$, or C$_2$H$_4$. Also, a process temperature in the reaction chamber may be from about 300° C. to about 700° C. Plasma power used during the PECVD process may be from about 50 W to about 300 W, and process pressure in the reaction chamber may be from about 10 mTorr to about 50 mTorr. However, process conditions are not limited thereto.

When the PECVD process is performed under such process conditions, graphene first starts to grow on the exposed surface of the semiconductor substrate 511, and the first graphene layer 531 having a certain thickness is formed. Here, carbide may be formed on an interface between the semiconductor substrate 511 and the graphene being grown. However, inventive concepts are not limited thereto, and carbide may not be formed.

Next, graphene also starts to grow on the surface of the insulating layer 512 after a certain incubation time, and the second graphene layer 532 having a certain thickness is formed. Here, the incubation time denotes a time for nuclei for growing the graphene on the surface of the insulating layer 512 to be generated. After the incubation time, the first and second graphene layers 531 and 532 may be respectively grown on the surfaces of the semiconductor substrate 511 and the insulating layer 512, and at this time, the first and second graphene layers 531 and 532 may have different thicknesses. For example, the first graphene layer 531 grown on the surface of the semiconductor substrate 511 may have the thickness t1 greater than the thickness t2 of the second graphene layer 532 grown on the surface of the insulating layer 512.

As such, the first and second graphene layers 531 and 532 having different thicknesses may be grown respectively on the exposed surface of the semiconductor substrate 511 and on the surface of the insulating layer 512 by adjusting a growth time during the PECVD process.

Figure 7:
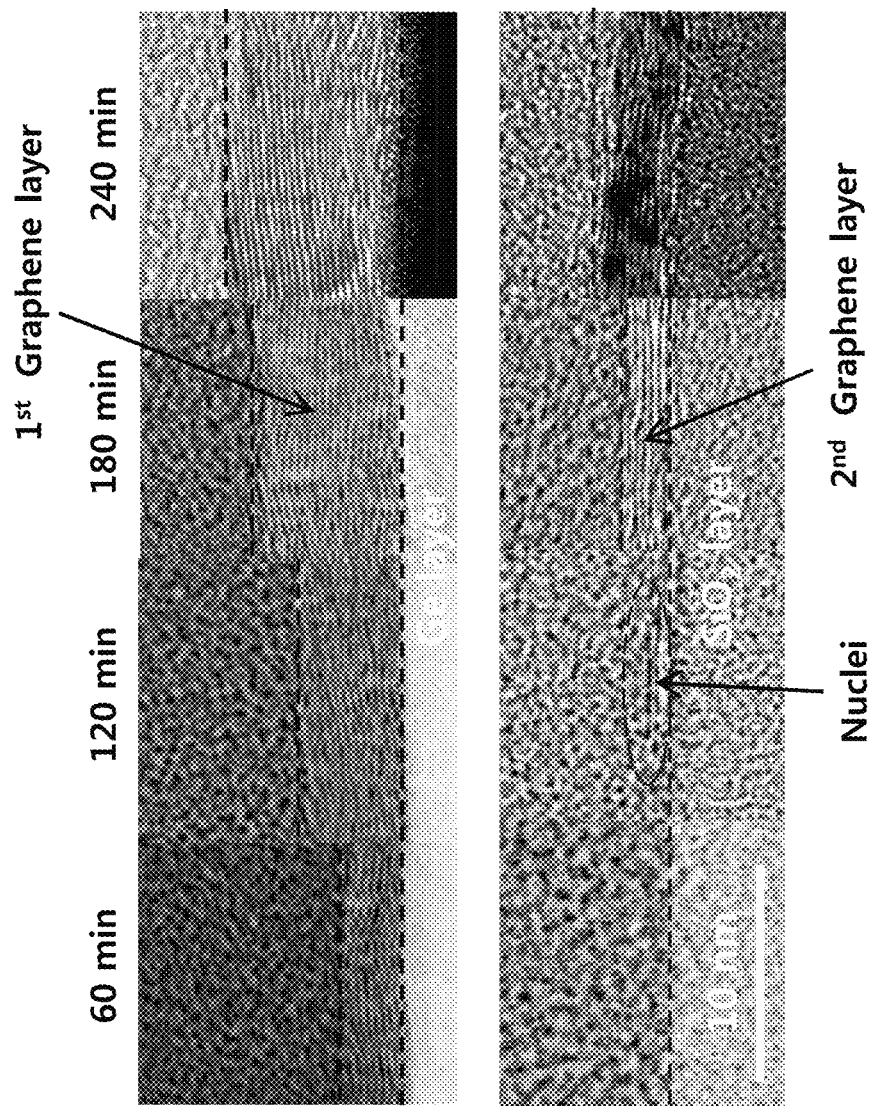
FIG. 7 is a photograph of graphene layers having different thicknesses according to growth times, grown on a surface of a Ge semiconductor layer and on a surface of an SiO$_2$ insulating layer during a PECVD process.

FIG. 7 is a photograph of graphene layers having different thicknesses according to growth times, grown on a surface of a Ge semiconductor layer and on a surface of an SiO$_2$ insulating layer during a PECVD process. During the PECVD process, a CH$_4$ source gas, process pressure of 20 mTorr, a process temperature of 580° C., and plasma power of 150 W are used as process conditions.

Referring to FIG. 7, a thickness of a first graphene layer formed on the surface of the Ge semiconductor layer gradually increases as a growth time increases to 60 minutes, 120 minutes, 180 minutes, and 240 minutes, after graphene starts to grow on the surface of the Ge semiconductor layer at an initial point of time in the PECVD process.

Meanwhile, graphene does not grow on the surface of the SiO$_2$ insulating layer up to the growth time of about 120 minutes, and after the growth time of 120 minutes, nuclei for graphene growth are generated. In this case, an incubation time may be about 120 minutes. After the incubation time, a thickness of a second graphene layer formed on the surface of the SiO$_2$ insulating layer gradually increases as the growth time increases to 180 minutes and 240 minutes. Here, at the same growth time, the thickness of the first graphene layer formed on the surface of the Ge semiconductor layer is greater than the thickness of the second graphene layer formed on the surface of the SiO$_2$ insulating layer.

As such, the first and second graphene layers having different thicknesses may be grown respectively on the surfaces of the Ge semiconductor layer and the SiO$_2$ insulating layer, or the first graphene layer may be grown only on the surface of the Ge semiconductor layer by suitably adjusting the growth time during the PECVD process. For example, the first and second graphene layers having different thicknesses may be grown respectively on the surfaces of the Ge semiconductor layer and the SiO$_2$ insulating layer by adjusting the growth time to be greater than a certain time (e.g., the incubation time) during the PECVD process. Meanwhile, when the growth time is adjusted to be within the certain time (e.g., the incubation time), the first graphene layer may be grown only on the surface of the Ge semiconductor layer.

As such, according to the current embodiment, a semiconductor device may be manufactured by growing the first and second graphene layers 531 and 532 having different thicknesses directly respectively on the surfaces of the semiconductor substrate 511 and the insulating layer 512 by using the PECVD process.

Figure 8:
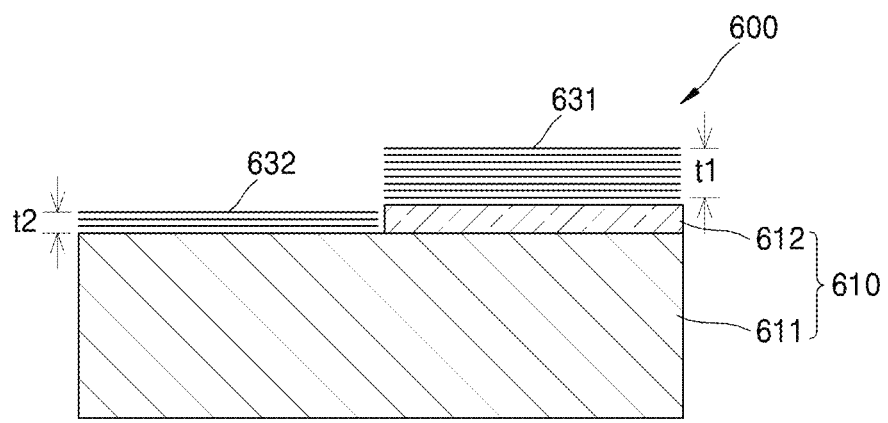
FIG. 8 is a cross-sectional view of a semiconductor device according to some example embodiments.

FIG. 8 is a cross-sectional view of a semiconductor device 600 according to some example embodiments.

Referring to FIG. 8, the semiconductor device 600 includes a substrate 610 including an insulator and a semiconductor, a first graphene layer 631 grown on a surface of the semiconductor of the substrate 610, and a second graphene layer 632 grown on a surface of the insulator of the substrate 610. The substrate 610 may include an insulator substrate 611 and a semiconductor layer 612 patterned on a surface of the insulator substrate 611 in a certain form. Here, the surface of the insulator substrate 611 and a surface of the semiconductor layer 612 may be provided on planes having different heights.

The insulator substrate 611 may include at least one material from among $SiO_2$, SiN, $SiO_xN_y$, wherein 0<x and y<1, $SiO_xC_y$, wherein 0<x and y<1, $GeO_xN_y$, wherein 0<x and y<1, $GeO_xC_y$, wherein 0<x and y<1, $Al_2O_3$, $HfO_2$, and $ZrO_2$. The semiconductor layer 612 may include at least one of a group IV material and a group III-V compound. For example, the semiconductor layer 612 may include at least one material from among Si, Ge, Sn, GaAs, GaP, InAs, InP, InSb, GaSb, GaN InN, AlP, AlAs, and AlN. However, a material of the semiconductor layer 612 is not limited thereto, and may include various semiconductor materials. For example, the semiconductor layer 612 may include an Si—Ge—Sn—C alloy, an Si—Ge—C alloy, or an Si—Ge—Sn alloy. Meanwhile, the semiconductor layer 612 may further include a doping material including at least one material from among B, As, P, Sb, C, Si, and Mg. Here, concentration of the doping material may be from about $10^{15}$ to about $10^{22}$ cm$^{-3}$.

The first graphene layer 631 is formed on a surface of the semiconductor layer 612, and the second graphene layer 632 is formed on an exposed surface of the insulator substrate 611. Here, the first and second graphene layers 631 and 632 may each include one graphene or a plurality of stacked graphenes.

The first and second graphene layers 631 and 632 may have different thicknesses. For example, the thickness t1 of the first graphene layer 631 may be greater than the thickness t2 of the second graphene layer 632. The first and second graphene layers 631 and 632 may be respectively grown on the surface of the semiconductor layer 612 and the surface of the insulator substrate 611 in different thicknesses by adjusting a growth time during a PECVD process.

In order to manufacture the semiconductor device 600, the substrate 610 including the semiconductor and the insulator are prepared in a reaction chamber (not shown). Here, the substrate 610 may include the insulator substrate 611 and the semiconductor layer 612 patterned on the surface of the insulator substrate 611.

Then, the first and second graphene layers 631 and 632 are grown respectively on the surface of the semiconductor layer 612 and on the exposed surface of the insulator substrate 611 through a PECVD process. A source gas supplied into the reaction chamber during the PECVD process may be hydrocarbon, such as $CH_4$, $C_2H_2$, or $C_2H_4$. Also, a process temperature in the reaction chamber may be from about 300° C. to about 700° C., but is not limited thereto. Plasma power used during the PECVD process may be from about 50 W to about 300 W, and process pressure in the reaction chamber may be from about 10 mTorr to about 50 mTorr, but are not limited thereto.

When the PECVD process is performed under such process conditions, graphene first starts to grow on the exposed surface of the semiconductor layer 612, and the first graphene layer 631 having a certain thickness is formed. Then, graphene also starts to grow on the exposed surface of the insulator substrate 611 after a certain incubation time, and the second graphene layer 632 having a certain thickness is formed. Accordingly, after the incubation time, the first and second graphene layers 631 and 632 may be respectively grown on the surfaces of the semiconductor layer 612 and the insulator substrate 611. Here, the first graphene layer 631 grown on the surface of the semiconductor layer 612 may have the thickness t1 greater than the thickness t2 of the second graphene layer 632 grown on the surface of the insulator substrate 611.

Figure 9:
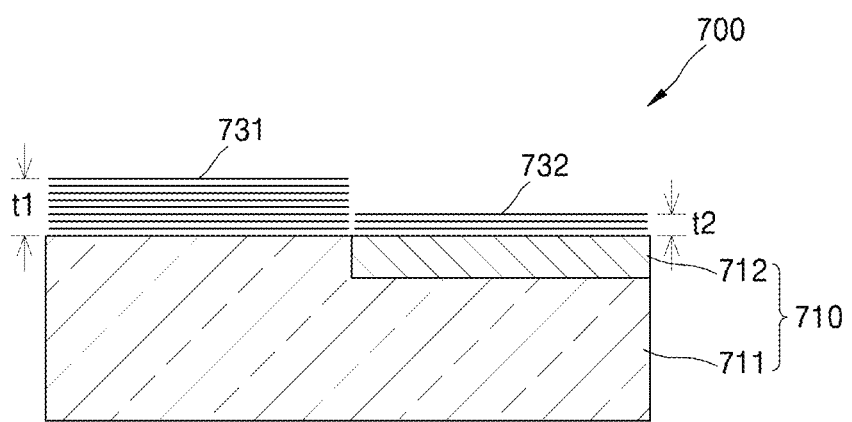
FIG. 9 is a cross-sectional view of a semiconductor device according to some example embodiments.

FIG. 9 is a cross-sectional view of a semiconductor device 700 according to some example embodiments.

Referring to FIG. 9, the semiconductor device 700 includes a substrate 710 including an insulator and a semiconductor, a first graphene layer 731 grown on a surface of the semiconductor of the substrate 710, and a second graphene layer 732 grown on a surface of the insulator of the substrate 710. The substrate 710 may include a semiconductor substrate 711 and an insulating layer 712 patterned on a surface of the semiconductor substrate 711 in a certain form. Here, an exposed surface of the semiconductor substrate 711 and a surface of the insulating layer 712 may be provided on the same plane.

The semiconductor substrate 711 may include at least one of a group IV material and a group III-V compound. For example, the semiconductor substrate 711 may include at least one material from among Si, Ge, Sn, GaAs, GaP, InAs, InP, InSb, GaSb, GaN InN, AlP, AlAs, and AlN, but is not limited thereto. For example, the semiconductor substrate 711 may include an Si—Ge—Sn—C alloy, an Si—Ge—C alloy, or an Si—Ge—Sn alloy. Meanwhile, the semiconductor substrate 711 may further include a doping material including at least one material from among B, As, P, Sb, C, Si, and Mg.

The insulating layer 712 may include at least one material from among $SiO_2$, SiN, $SiO_xN_y$, wherein 0<x and y<1, $SiO_xC_y$, wherein 0<x and y<1, $GeO_xN_y$, wherein 0<x and y<1, $GeO_xC_y$, wherein 0<x and y<1, $Al_2O_3$, $HfO_2$, and $ZrO_2$.

The first and second graphene layers 731 and 732 having different thicknesses may be respectively formed on the exposed surface of the semiconductor substrate 711 and the surface of the insulating layer 712. Here, the thickness t1 of the first graphene layer 731 may be greater than the thickness t2 of the second graphene layer 732. Each of the first and second graphene layers 731 and 732 may include one graphene or a plurality of stacked graphenes.

The first and second graphene layers 731 and 732 may be grown respectively on the surfaces of the semiconductor substrate 711 and the insulating layer 712 via a PECVD process to have different thicknesses. For example, first, the substrate 710 including the semiconductor substrate 711 and the insulating layer 712 provided on the surface of the semiconductor substrate 711 is prepared. Here, the exposed surface of the semiconductor substrate 711 and the surface of the insulating layer 712 may be on the same plane.

Then, the first and second graphene layers 731 and 732 are grown respectively on the exposed surface of the semiconductor substrate 711 and the surface of the insulating layer 712 through the PECVD process. A source gas supplied into the reaction chamber during the PECVD process may be hydrocarbon, such as $CH_4$, $C_2H_2$, or $C_2H_4$. Also, a process temperature in the reaction chamber may be from about 300° C. to about 700° C., but is not limited thereto. Plasma power used during the PECVD process may be from about 50 W to about 300 W, and process pressure in the reaction chamber may be from about 10 mTorr to about 50 mTorr, but are not limited thereto.

When the PECVD process is performed under such process conditions, graphene first starts to grow on the exposed surface of the semiconductor substrate 711, and the first graphene layer 731 having a certain thickness is formed. Then, graphene also starts to grow on the surface of the insulating layer 712 after a certain incubation time, and the second graphene layer 732 having a certain thickness is formed. Accordingly, the first and second graphene layers 731 and 732 having different thicknesses may be respectively grown on the surfaces of the semiconductor substrate 711 and the insulating layer 712. Here, the first graphene layer 731 grown on the surface of the semiconductor substrate 711 may have the thickness t1 greater than the thickness t2 of the second graphene layer 732 grown on the surface of the insulating layer 712.

Figure 10:
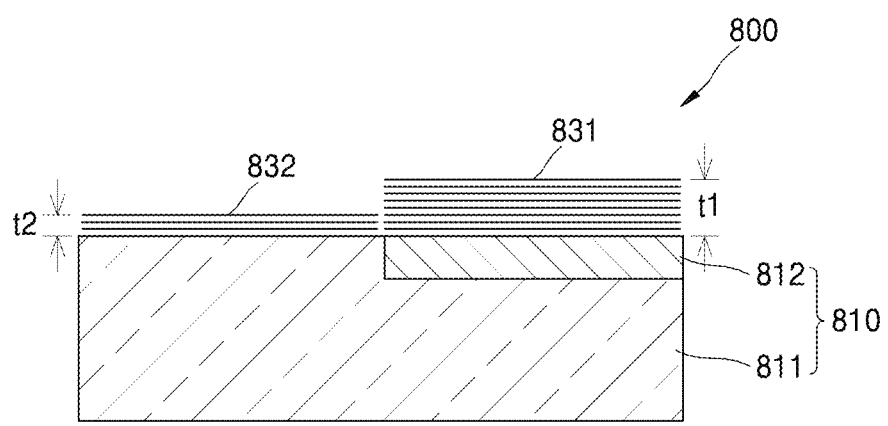
FIG. 10 is a cross-sectional view of a semiconductor device according to some example embodiments.

FIG. 10 is a cross-sectional view of a semiconductor device 800 according to some example embodiments.

Referring to FIG. 10, the semiconductor device 800 includes a substrate 810 including an insulator and a semiconductor, a first graphene layer 831 grown on a surface of the semiconductor of the substrate 810, and a second graphene layer 832 grown on a surface of the insulator of the substrate 810. The substrate 810 may include an insulator substrate 811 and a semiconductor layer 812 patterned on a surface of the insulator substrate 811 in a certain form. Here, the insulator substrate 811 may include surfaces having different heights, and the semiconductor layer 812 may be provided on a low surface from the surfaces of the insulator substrate 811. Accordingly, an exposed surface of the insulator substrate 811 and a surface of the semiconductor layer 812 may be provided on the same plane.

The insulator substrate 811 may include at least one material from among $SiO_2$, $SiN$, $SiO_xN_y$, wherein 0<x and y<1, $SiO_xC_y$, wherein 0<x and y<1, $GeO_xN_y$, wherein 0<x and y<1, $GeO_xC_y$, wherein 0<x and y<1, $Al_2O_3$, $HfO_2$, and $ZrO_2$.

The semiconductor layer 812 may include at least one of a group IV material and a group III-V compound. For example, the semiconductor layer 812 may include at least one material from among Si, Ge, Sn, GaAs, GaP, InAs, InP, InSb, GaSb, GaN InN, AlP, AlAs, and AlN, but is not limited thereto. For example, the semiconductor layer 812 may include an Si—Ge—Sn—C alloy, an Si—Ge—C alloy, or an Si—Ge—Sn alloy. Meanwhile, the semiconductor layer 812 may further include a doping material including at least one material from among B, As, P, Sb, C, Si, and Mg.

The first graphene layer 831 is formed on the surface of the semiconductor layer 812 and the second graphene layer 932 is formed on the exposed surface of the insulator substrate 811. Here, each of the first and second graphene layers 831 and 832 may include one graphene or a plurality of stacked graphenes. The first and second graphene layers 831 and 832 formed respectively on the surfaces of the semiconductor layer 812 and the insulator substrate 811 may have different thicknesses. For example, the thickness t1 of the first graphene layer 831 may be greater than the thickness t2 of the second graphene layer 832.

The first and second graphene layers 831 and 832 are respectively grown on the surfaces of the semiconductor layer 812 and the insulator substrate 811 in different thicknesses by adjusting a growth time during the PECVD process.

For example, the substrate 810 including the insulator substrate 811 and the semiconductor layer 812 patterned on the surface of the insulator substrate 811 is prepared in a reaction chamber (not shown). Then, the first and second graphene layers 831 and 832 are grown respectively on the surface of the semiconductor layer 812 and the exposed surface of the insulator substrate 811 through the PECVD process. A source gas supplied into the reaction chamber during the PECVD process may be hydrocarbon, such as $CH_4$, $C_2H_2$, or $C_2H_4$. Also, a process temperature in the reaction chamber may be from about 300° C. to about 700° C., but is not limited thereto. Plasma power used during the PECVD process may be from about 50 W to about 300 W, and process pressure in the reaction chamber may be from about 10 mTorr to about 50 mTorr, but are not limited thereto.

When the PECVD process is performed under such process conditions, graphene first starts to grow on the surface of the semiconductor layer 812, and the first graphene layer 831 having a certain thickness is formed. Then, graphene also starts to grow on the exposed surface of the insulator substrate 811 after a certain incubation time, and the second graphene layer 832 having a certain thickness is formed. Accordingly, the first and second graphene layers 831 and 832 having different thicknesses may be respectively grown on the surfaces of the semiconductor layer 812 and the insulator substrate 811. Here, the first graphene layer 831 grown on the surface of the semiconductor layer 812 may have the thickness t1 greater than the thickness t2 of the second graphene layer 832 grown on the surface of the insulator substrate 811.

According to one or more embodiments, a semiconductor device may include a graphene layer selectively formed on a surface of a substrate including two types of materials, e.g., a semiconductor and an insulator. Here, the graphene layer may be formed only on a surface of the semiconductor or formed on surfaces of the semiconductor and the insulator in different thicknesses. The semiconductor device may be manufactured by growing the graphene layer directly only on the surface of the semiconductor or the graphene layers having different thicknesses directly on the surfaces of the semiconductor and the insulator via a PECVD process. Accordingly, the graphene layer may be selectively grown according to a structure of the substrate including two types of materials, and thus the graphene layer may be formed only on a desired region of the substrate.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:
   a semiconductor substrate including an insulator, wherein the semiconductor substrate is one of Si, Ge, Sn, GaAs, GaP, InAs, InP, InSb, GaSb, GaN, InN, AlP, AlAs, or AlN;
   a first graphene layer grown on a surface of the semiconductor substrate, the first graphene layer being directly on the surface of the semiconductor substrate and not directly on the surface of the insulator, the first graphene having a width in a first direction that is greater than a thickness of the first graphene in a second direction crossing the first direction; and
   a second graphene layer grown on a surface of the insulator, a thickness of the second graphene layer being different than a thickness of the first graphene layer, the second graphene layer being directly on the surface of the insulator, the second graphene having a width in the first direction that is greater than a thickness of the second graphene in the second direction, the first graphene and the second graphene being parallel to each other such that the width of the first graphene and the width of the second graphene each extend in the first direction, and a lower surface of the insulator is not directly on the first graphene, wherein the thickness of the first graphene layer is greater than the thickness of the second graphene layer, the semiconductor substrate further includes a doping material, and the insulator includes at least one of silicon oxide ($SiO_2$), silicon nitride (SiN), silicon oxynitride ($SiO_xN_y$), silicon oxycarbide ($SiO_xC_y$), germanium oxynitride ($GeO_xN_y$), germanium oxycarbide ($GeO_xC_y$), aluminum oxide ($Al_2O_3$), hafnium oxide ($HfO_2$), or zirconium oxide ($ZrO_2$), $0<x$, and $0<y<1$.

* * * * *